United States Patent [19]

Peng et al.

[11] Patent Number: 5,731,243
[45] Date of Patent: Mar. 24, 1998

[54] METHOD OF CLEANING RESIDUE ON A SEMICONDUCTOR WAFER BONDING PAD

[75] Inventors: Tzu-min Peng; Yung-Haw Liaw; Cheng-Te Chu; Hsin-chieh Huang, all of Hsin-Chu, Taiwan

[73] Assignee: Taiwan Semiconductor Manufacturing Company, Ltd., Hsin-Chu, Taiwan

[21] Appl. No.: 523,775

[22] Filed: Sep. 5, 1995

[51] Int. Cl.$^6$ .................. H01L 21/28; H01L 21/304; H01L 21/3065
[52] U.S. Cl. .............. 438/612; 438/669; 438/691; 438/694; 438/745; 438/759; 438/780
[58] Field of Search .................. 438/612, 669, 438/691, 694, 745, 759, 780, 906, 907, 928, 959, 974, 976, 977

[56] References Cited

U.S. PATENT DOCUMENTS

| | | |
|---|---|---|
| 4,587,771 | 5/1986 | Buchner et al. . |
| 5,300,172 | 4/1994 | Ishiwata et al. . |
| 5,366,589 | 11/1994 | Chang . |
| 5,480,842 | 1/1996 | Clifton et al. . |
| 5,545,076 | 8/1996 | Yun et al. . |

Primary Examiner—David Graybill
Attorney, Agent, or Firm—George O. Saile; Stephen B. Ackerman; William J. Stoffel

[57] ABSTRACT

A method for backside grinding a semiconductor wafer and forming a contamination free bonding pad connection. The method comprises forming a passivation layer over a metal layer. Applying a photoresist pattern with an opening which will define a bonding pad area and removing the passivation layer exposed in the opening. Next, the photoresist is removed, but a polymer residue is often formed on the surfaces of the passivation layer surrounding the bonding pad. In a novel step, the residue is removed using an etchant containing Dimethylsulfoxide (D.M.D.O.) aud Monoethanolamine (M.E.A.) and is followed by au oxygen plasma treatment. Next, the device side of the wafer is covered with a protective tape and the backside of the wafer is grouud back. The tape is removed revealing a contamination free bonding pad area. A bonding connection is then made to the bonding pad.

13 Claims, 5 Drawing Sheets

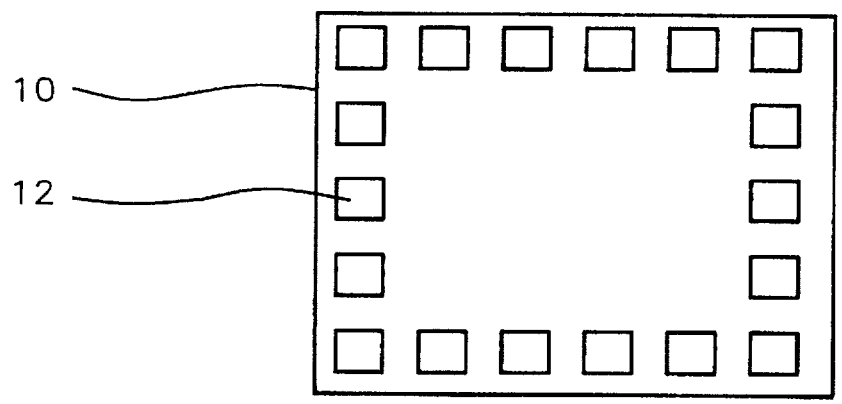
FIG. 1 - Prior Art
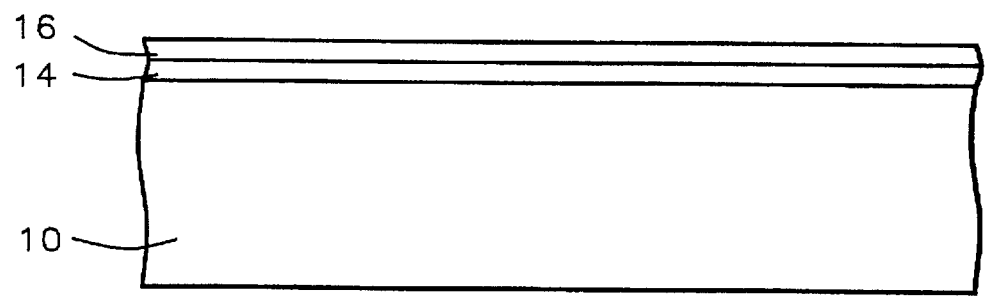
FIG. 2 - Prior Art
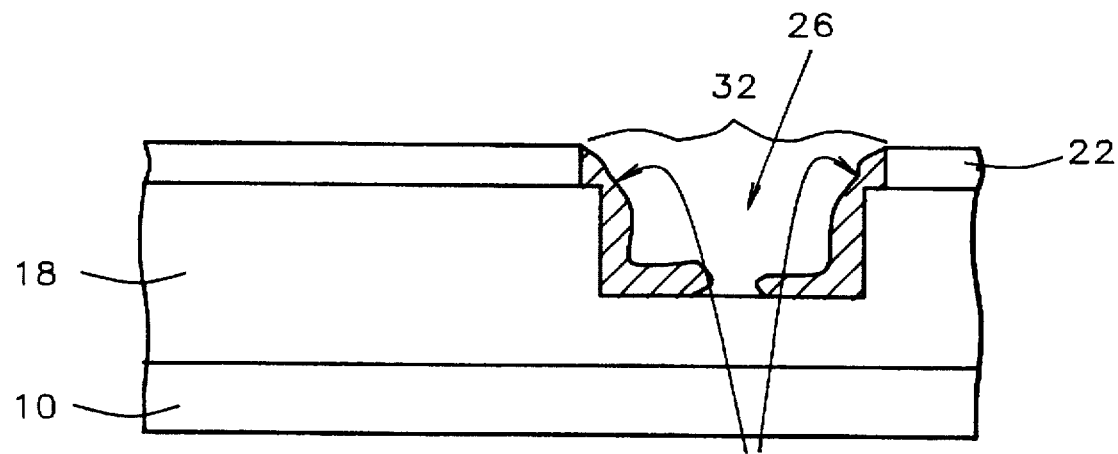
FIG. 3 - Prior Art

METHOD OF CLEANING RESIDUE ON A SEMICONDUCTOR WAFER BONDING PAD

BACKGROUND OF THE INVENTION

1. Field of the Invention

The present invention relates to a method for manufacturing a semiconductor device, and more particularly to a method for back side grinding and manufacturing a contamination free bonding pad connection.

2. Description of the Prior Art

After an integrated circuit device has completed the fabrication process, it is usually assembled into a package to be utilized on a printed circuit board as part of a larger circuit. In order for the inner leads of the package to make electrical contact with the bonding pads of the fabricated devices, a metal bond is formed at the bonding pad of the device with a lead extending to the inner lead of the package lead frame. The bond pad and the metal lead must be clean since any small amount of contamination can cause a metal bond failure and reduce yields.

The wafer backside grinding process and front side tape process are manufacturing steps which have been known to contaminate bonding pads. As shown in FIG. 1, bonding pads 12 are formed on substrate 10. After the bonding pads are formed, the wafer front side, (i.e., the side the devices are formed on) is covered with a protective tape and the back side of the wafer is ground don. The wafer is ground down because the thinner substrate can release more heat thus allowing the chips to run cooler. Tape is used on the front side (device side) of the wafer as a protective layer because the wafer is positioned on a grinding chuck and faced device side down during the wafer backside grinding process.

As shown in FIG. 2, the top side of the substrate 10 is covered with a tape 14 16 comprised of an adhesion film 14 and a tape layer 16. Alter the grinding process, the tape is removed. However, some of the tape adhesive layer 14 often adheres to the bonding pad as shown in FIG. 3. FIG. 3 shows a simplified view of a substrate surface having a bonding pad 26. A metal layer 18 overlies the substrate surface. A passivation layer 22 overlie the metal layer 18. A photo process is used to define the opening 32 through the passivation layer. As explained above, after the bonding pad is formed, a tape layer covers the surface as shown in FIG. 2. The backside of the wafer is ground down then the tape 14 16 is removed. However some of the tape adhesive 24 remains in the bonding pad area 26. The remaining tape adhesive residue 24 causes bonding pad failures (e.g., metal won't properly adhere to the bonding pad).

There is a need to develop a cost effective process Which will eliminate the tape adhesive contamination problem near the bonding pad areas.

SUMMARY OF THE INVENTION

It is an object of the present invention to provide a method to reduce contamination in and near the bonding pad areas.

It is another object of the present invention to eliminate contamination from tape adhesives which form on the wafer front side and particularly in and near bonding pad areas.

It is yet another object of the present invention to provide an improved process to grind the back side of a substrate and prevent tape residue formations near the bonding pad.

The method of this invention for thinning a semiconductor wafer by backside grinding and preventing tape residue formation near a bond pad which overcomes the above-discussed and numerous other disadvantages of the prior art, comprises: forming devices and conductive layers on a top side of a substrate. Devices and conductive layers are formed on a top side of a substrate, the substrate having a bottom side. Next, a first metal layer having a bonding pad is formed over the substrate surface. A passivation layer is formed over at least the first metal layer and the bonding pad.

Subsequently, a photoresist layer, having first opening over the bonding pad, is formed over the passivation layer. A second opening is then anisotropically etched through the passivation layer as defined by the first opening, and the bonding pad is exposed. The etch process often creates forming a polymer residue on the passivation layer near the second opening. The photoresist layer is then removed.

The passivation layer and the bonding pad are cleaned with an etchant including Dimethylsulfoxide (D.M.D.O.) and Monoethanolamine (M.E.A.) thereby removing the polymer residue. Next, the substrate is etched with an oxygen plasma process to remove any remaining residue and any remaining etchant.

Next, a tape is applied over the top side of the substrate. The bottom side of the substrate is ground and the tape is removed. Because cleaning process removed the polymer residue that the tape adhesive sticks to, no tape adhesive is left in the bonding pad. Lastly, a metal connection is formed to the bonding pad.

The surfaces of the passivation layer and the bonding pad are cleaned by the etchant containing Dimethylsulfoxide (D.M.D.O.) and Monoethanolamine (M.E.A.) which removes the polymer residue left by the anisotropic etch of the passivation layer. By removing the polymer resist, contamination from the subsequent from side tape process is eliminated. The bonding pad is free of tape adhesives and good reliable bonding pad connections can be made.

BRIEF DESCRIPTION OF THE DRAWINGS

The drawings show the following:

FIG. 1 is a top down view of bonding pad area on a substrate according to the prior art process.

FIG. 2 is a cross sectional view in broken section in greatly enlarged scale that shows the prior art process for applying a tape over the device side era substrate prior to back side grinding.

FIG. 3 is a cross sectional view in broken section in greatly enlarged scale that shows the prior art process where tape adhesive remains in the bonding pad area after tape removal after back side grinding.

DETAILED DESCRIPTION OF THE PREFERRED EMBODIMENTS

The present invention will be described in detail with reference to the accompanying drawings. It should be noted that the drawings are in greatly simplified form. In practice the semiconductor substrate will have many device structures formed within and thereon and the devices will be connected with suitable metallurgy in various electronic electric circuit configurations and many bonding pad connections can be formed on the substrate.

Accordingly, the present invention provides a method for eliminating bonding pad contamination, particularly contamination from a front (e.g., top, device) side tape process. The method begins by forming devices within and on top of a semiconductor substrate 10. Devices and conductive layers are then formed on the top side of the substrate (not shown).

Figure 4:
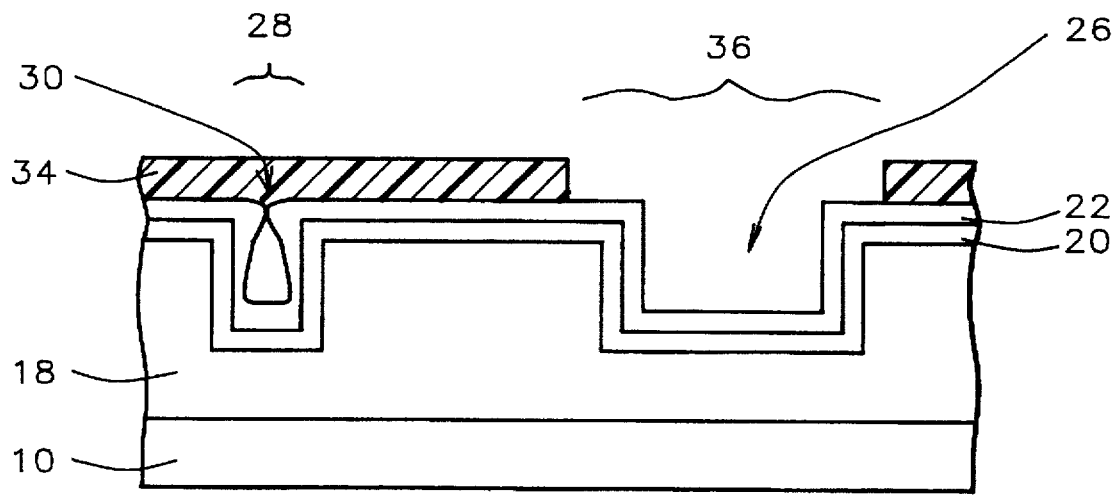
FIGS. 4 through 8 are cross sectional views in broken section in greatly enlarged scale that show the improved process of the present invention for forming a contamination free bonding pad connection.

As shown in FIG. 4, a first metal layer 18 is formed over the substrate surface including other conductive and passivation layers. The first metal layer 18 can be formed of AlSi (aluminum silicon alloy), AlGa (aluminum cooper alloy), and AlSiCu (aluminum silicon cooper alloy) and is preferably formed of AlSiCu. The first racial layer 18 can have a thickness in the range from about 7000 to 9000 and more preferably a thickness of about 8000 angstroms.

The first metal layer 18 is patterned to define a bonding pad 26 and groove 28. Groove 28 represents the space between adjacent devices, such as the spacing between two metal lines.

Next, a first passivation layer 20 is formed over the substrate surface. The first passivation layer can be formed of phosphosilicate glass (PSG), and silicon oxide and is preferably formed of silicon oxide. The silicon oxide layer 20 can be formed by decomposing Tetraethoxysilane (TEOS) or by other conventional deposition/oxidation processes. The first passivation layer has a thickness in the range of about 2000 to 7000 Å and more preferably a thickness of about 5000 Å.

A second passivation layer 22 can then be formed over the first passivation layer. The second passivation layer is preferably formed of silicon nitride. The silicon nitride can be formed by conventional processes, such as a low pressure chemical vapor deposition, a ultraviolet nitride process or a plasma enhanced chemical vapor deposition (PECVD) process. The silicon nitride second passivation layer is preferably formed by a PECVD process. The second passivation layer has a thickness in the range of about 5000 to 9000 and more preferably a thickness of about 7000. The first and second passivation layers can be formed of a single layer or multiple layers as is obvious to one skilled in the art.

As shown in FIG. 4, a photoresist layer 34 is formed over the substrate surface. The photoresist layer 34 has a first opening 36 over the bonding pad area. The photoresist can be made from a TSNR8700 photoresist by TOK company.

Next, the passivation layers 20, 22 are anisotropically etched through the opening 36 in the photoresist layer 34. An opening 32 is formed though the passivation layers 20 22 over the bonding pad area 26 as shown in FIG. 5.

The photoresist layer 34 is then removed. The photoresist layer 34 can be removed with conventional photoresist removal strippers, such as EKC 265 (Hyroxylamine, $H_2O$, DCA (Diglycolamine and Catechol) by E.K.C. company and EKC 830 (Digyucolamine and N-Methyl Pyrrolidone) by E.K.C. company.

Figure 5:
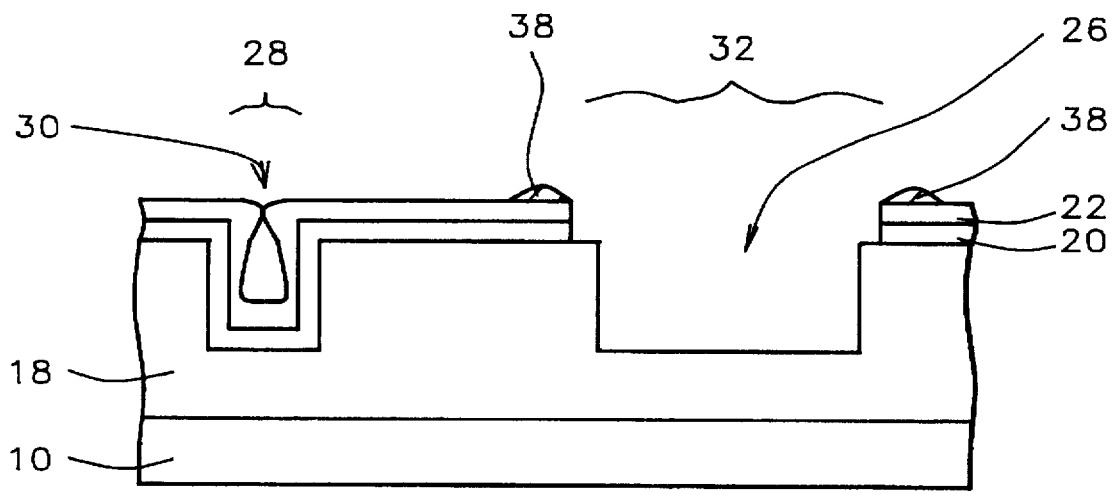

This process causes a polymer resist 38 to form along the passivation layer surfaces 20, 22 as shown in FIG. 5. The polymer can be formed by the reaction of the photoresist, passivation layers 20, 22 and the etching gas during the passivation layer etching process.

As will be explained below, this polymer residue 38 causes the bonding pad contamination problem during the subsequent tape process. The residue polymer will react with and adhere to the adhesive layers 14 of the tape. This polymer residue 38 pad can cause the bonding pad contamination problem from the tape as shown in FIG. 3 of the prior art.

To remove this polymer residue 38, the substrate surface is cleaned with an etchant including Dimethylsulfoxide (D.M.S.O.) and Monoethanolamine (M.E.A.) which can remove the polymer residue. Preferably the etchant, ACT 690C from Advanced Chemical Technologies Company is used. The wafers can be cleaned in a wafer cleaning tool manufactured by Kaiyo, with a flow rate in the range between about 15 to 25 liters per minute and at a temperature between about 100° to 120° C. Sometimes, the etchant and other chemical 31 remain in keyhole 30 as shown in FIG. 6.

Figure 6:
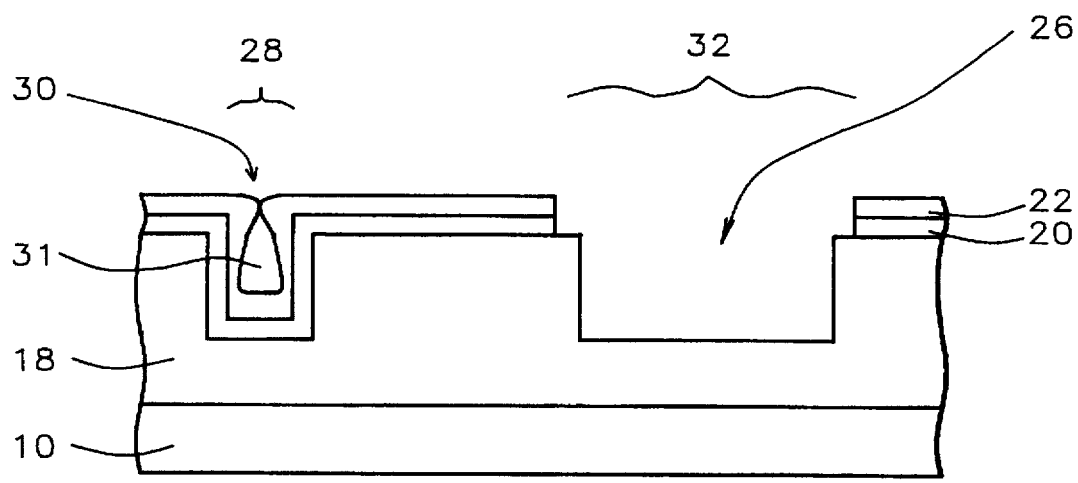
Figure 7:
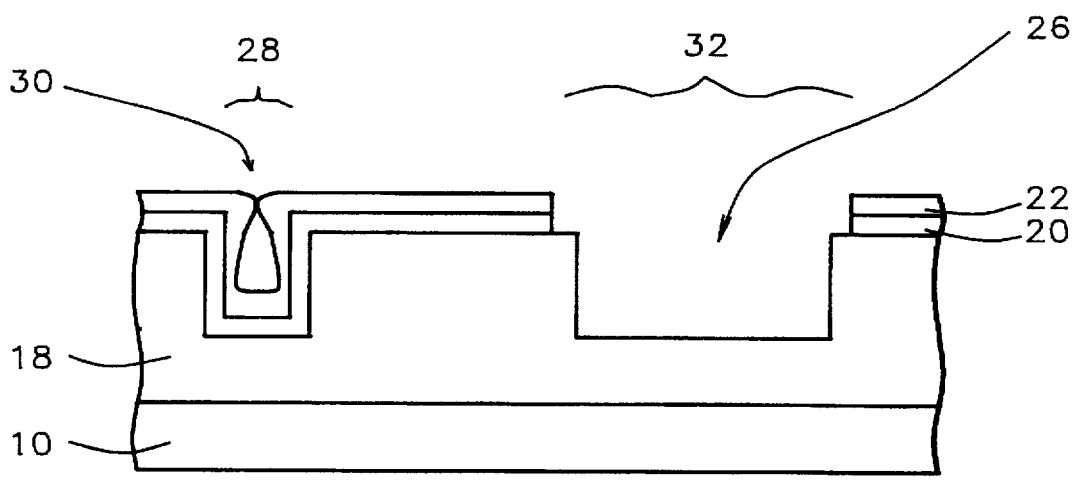

After this an oxygen plasma treatment is performed on the substrate surface to ensure that the bonding pad area 26 is clean of all contamination as shown in FIG. 6. The oxygen plasma treatment can be performed insitu in an etcher by PSC for a time between about 15 to 100 minutes, at a temperature between about 50° to 100° C., at a pressure between about 500 to 1000 mTorr. The oxygen treatment removes some of the chemicals in the keyhole 30 and solidifies the remaining chemicals 31 in the keyhole 30 as shown in FIG. 7. The oxygen plasma treatment is important because if the ACT is not removed from the keyhole the ACT will evaporate and concentrate in the end point of the metal spacing during the alloy step, thus causing metal failures.

Subsequently, an optional heat treatment can be performed to anneal the metal alloys in other conductive layers. The heat treatment recovers the dangling bond of the interface between the gate oxide and the silicon substrate. The heat treatment can be performed at a temperature in the range between about 350° to 450° C. and for a time in the range between about 20 to 50 minutes.

After this, the taping process and back side grinding process is performed. A tape is applied over the top side (devices side) of the wafer. The tape can be tape model SB205SB made by Mitsui company. Preferably the tape has an adhesive strength in the range between about 160 to 190 gw/25 mm and more preferably a strength of about 180 gw\25 mm. A tape with an adhesive strength of 230 gw/25 mm or higher can increase bonding pad failures.

Next, the back side of the substrate is ground. The wafer can be ground by a diamond wheel. The thinner wafer allows heat to dissipate faster providing a cooler running chip.

Figure 8:
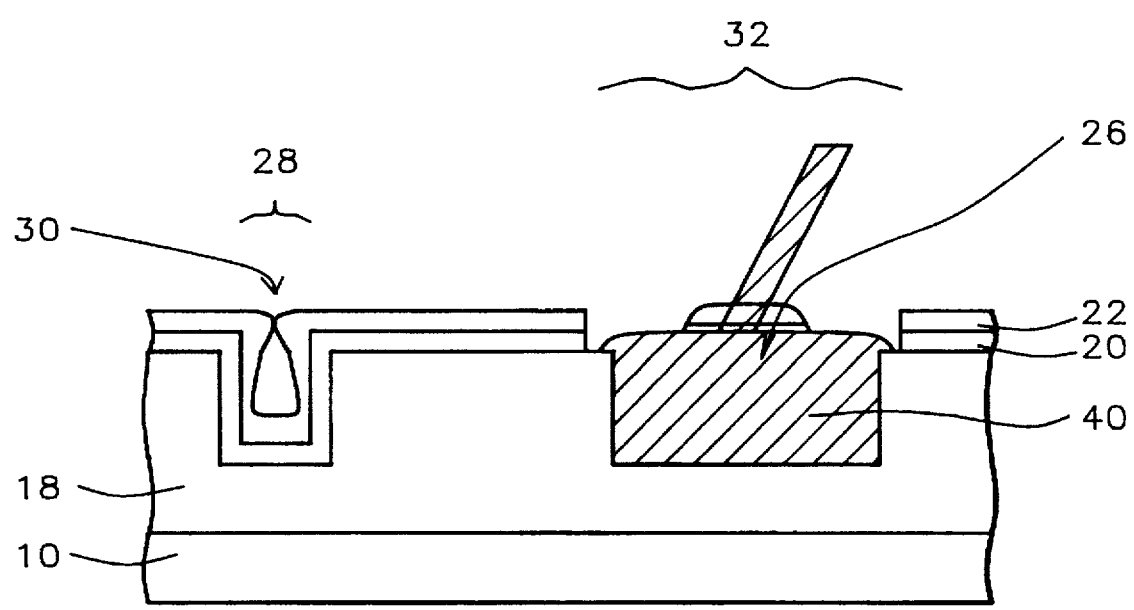
Figure 9:
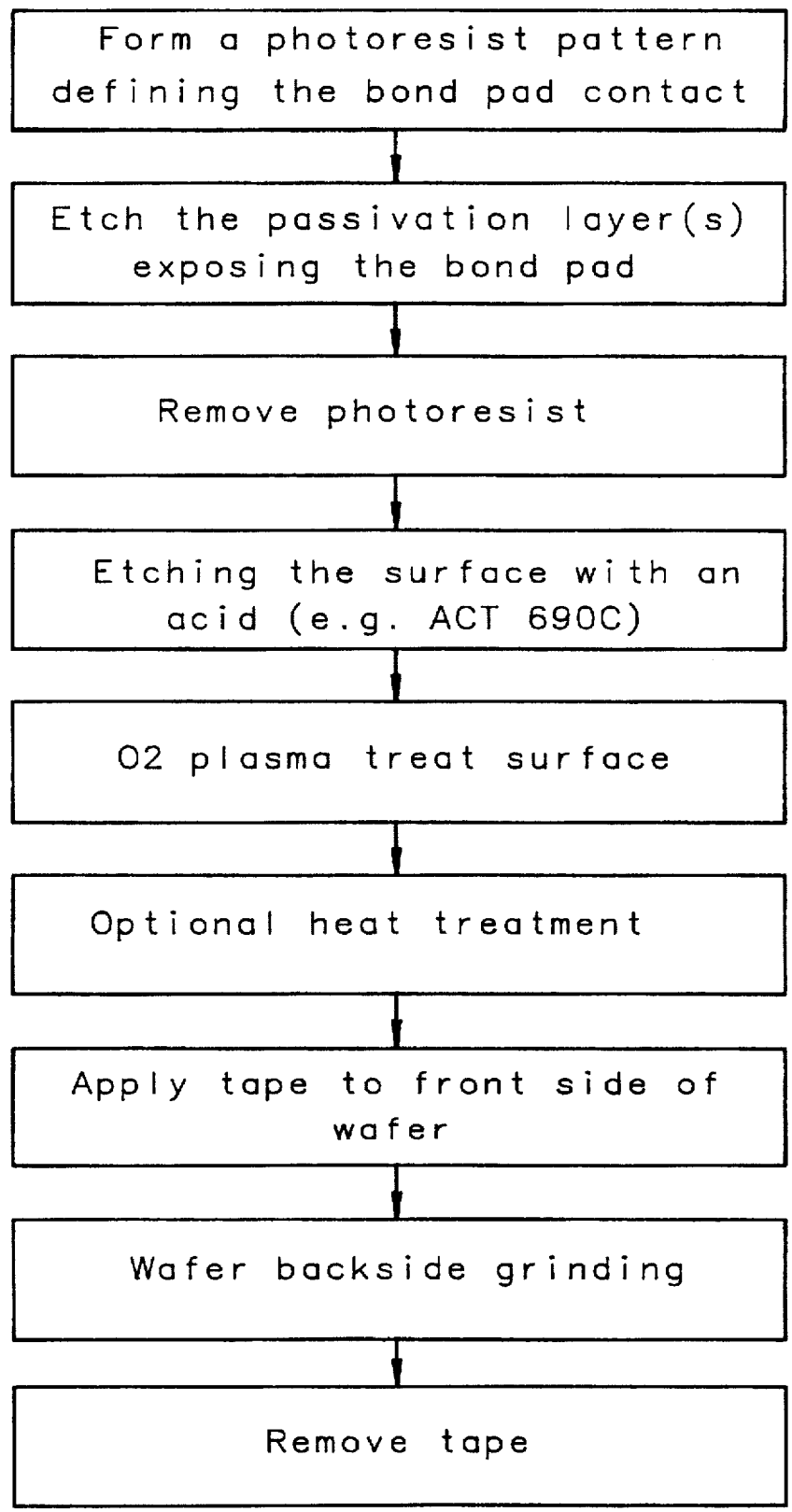
FIG. 9 is a flow chart of the steps of the present invention.

The tape is then removed. The tape can be removed by applying a peeling tape which has a higher adhesive strength. As shown in FIG. 7, the polymer residue is eliminated with the process of the invention. After this a bonding connection 40 is made to the bonding pad as shown in FIG. 8.

The method of this invention reduces bonding pad contamination from the front side tape process. In one implementation of the invention, bonding connection failures where lowered from approximately 8% to about 1.5% Coy implementing the etching with ACT-689C (containing Dimethylsulfoxide (D.M.D.O.) and Monoethanolamine (M.E.A.)). The bonding connection fails were even further reduced from 1.5% to near 0.0% by reducing the adhesive strength of the grinding tape from about 230 gw/25 mm to about 180 gw/25 mm. The invention is simple to implement, cost effective and greatly improves connection yields.

While the invention has been particularly shown and described with reference to the preferred embodiments thereof, it will be understood by those skilled in the art that various changes in form and details may be made without departing from the spirit and scope of the invention.

What is claimed is:

1. The method of thinning a semiconductor wafer by backside grinding and preventing tape residue formation near a bonding pad; the method comprising:

forming devices and conductive layers on a top side of a substrate, said substrate having a bottom side;

forming a first metal layer over the substrate surface, said first metal layer having a bonding pad;

forming a passivation layer over at least said first metal layer and said bonding pad;

forming a photoresist layer over said passivation layer, said photoresist layer having first opening over said bonding pad;

anisotropically etching a second opening through said passivation layer as defined by said first opening, and exposing said bonding pad thereby creating the potential for forming a polymer residue over the passivation layer near said second opening;

removing said photoresist layer;

cleaning said passivation layer and said bonding pad with an etchant including Dimethylsulfoxide (D.M.D.O.) and Monoethanolamine (M.E.A.) thereby removing said potential polymer residue;

applying a tape over said top side of said substrate;

grinding said bottom side of said substrate;

removing said tape; and forming a metal connection to said bonding pad.

2. The method of claim 1 where after cleaning said passivation layer and said bonding pad, the claim further includes, etching the substrate surface with an oxygen plasma for a time in the range of about 15 to 100 minutes and at a temperature in the range between about 50° to 100° C., and at a pressure between about 500 to 1000 mTorr.

3. The method of claim 2 where after cleaning the substrate surface with said etchant; the claim further includes, heat treating the substrate at a temperature in the range of about 350° to 450° C. and for a time in the range of about 20 to 50 minutes.

4. The method of claim 1 wherein said tape has an adhesive strength in the range between about 160 to 190 gw/25 mm.

5. The method of claim 1 wherein said passivation layer is formed of a first and a second passivation layers.

6. The method of claim 5 where said first passivation layer is formed of silicon oxide and has a thickness in the range from about 2000 to 7000 Å.

7. The method of claim 5 where said second passivation layer is formed of silicon nitride and has a thickness in the range from about 5000 to 9000 Å.

8. The method of thinning a semiconductor wafer by backside grinding and preventing tape residue formation near a bonding pad; the method comprising:

forming devices and conductive layers on a top side of a substrate, said substrate having a bottom side;

forming a first metal layer over said top side of said substrate, said first metal layer having a bonding pad;

forming a first passivation layer over at least said first metal layer and bonding pad;

forming a second passivation layer over at least said first passivation layer;

forming a photoresist layer over said passivation layer, said photoresist layer having first opening over said bonding pad;

anisotropically etching a second opening in said first and second passivation layers as defined by said first opening and exposing said bonding pad thereby creating the potential for forming a polymer residue over the first passivation layer near said second opening;

removing said photoresist layer;

cleaning said passivation layer and said bonding pad with an etchant including Dimethylsulfoxide (D.M.D.O.) and Monoethanolamine (M.E.A.) thereby removing said potential polymer residue;

etching said passivation layer and said bonding pad with an oxygen plasma for a time in the range of about 15 to 100;

applying a tape over said top side of said substrate;

grinding said bottom side of said substrate; and removing said tape.

9. The method of claim 8, where after etching said passivation layer and said bonding pad with said oxygen plasma, the claim further includes, heat treating the substrate at a temperature in the range of about 350° to 450° C. and for a time in the range of about 20 to 50 minutes.

10. The method of claim 8 wherein said tape has an adhesive strength in the range between about 160 to 190 gw/25 mm.

11. The method of claim 8 where said first passivation layer is formed of silicon oxide and has a thickness in the range from about 2000 to 7000 Å.

12. The method of claim 8 where said second passivation layer is formed of silicon nitride and has a thickness in the range from about 5000 to 9000 Å.

13. The method of claim 8 which further includes forming a metal connection to said bonding pad.

* * * * *